(12) United States Patent
Luz et al.

(10) Patent No.: US 8,729,915 B2
(45) Date of Patent: May 20, 2014

(54) CURRENT MONITOR FOR SENSING THE CURRENT IN A CURRENT PATH AND CORRESPONDING CONTROL DEVICE

(75) Inventors: Gerhard Luz, Bietigheim-Bissingen (DE); Dirk Wiegner, Schwaikheim (DE); Robin Machinal, Stuttgart (DE)

(73) Assignee: Alcatel Lucent, Paris (FR)

( * ) Notice: Subject to any disclaimer, the term of this patent is extended or adjusted under 35 U.S.C. 154(b) by 227 days.

(21) Appl. No.: 13/258,263

(22) PCT Filed: Mar. 16, 2010

(86) PCT No.: PCT/EP2010/053332
§ 371 (c)(1),
(2), (4) Date: Sep. 21, 2011

(87) PCT Pub. No.: WO2010/115681
PCT Pub. Date: Oct. 14, 2010

(65) Prior Publication Data
US 2012/0025854 A1   Feb. 2, 2012

(30) Foreign Application Priority Data
Apr. 8, 2009 (EP) .................................. 09157667

(51) Int. Cl.
*G01R 27/08* (2006.01)
(52) U.S. Cl.
USPC ........................................................ 324/705
(58) Field of Classification Search
USPC .............. 324/705–713, 600, 76.11, 323, 273, 324/234, 282, 344; 340/664, 660, 661, 662, 340/657
See application file for complete search history.

(56) References Cited

U.S. PATENT DOCUMENTS

| 6,316,967 | B1 | 11/2001 | Takagi et al. |
| 6,661,217 | B2 | 12/2003 | Kimball et al. |
| 2006/0028192 | A1 | 2/2006 | Ryu et al. |
| 2008/0018387 | A1 | 1/2008 | Ryu et al. |

FOREIGN PATENT DOCUMENTS

| EP | 1096262 A | 5/2001 |
| JP | 01-212364 A | 8/1989 |
| JP | 03-291710 A | 12/1991 |
| JP | 11-160368 A | 6/1999 |

OTHER PUBLICATIONS

International Search Report.

*Primary Examiner* — Melissa Koval
*Assistant Examiner* — Trung Nguyen
(74) *Attorney, Agent, or Firm* — Harness, Dickey & Pierce

(57) ABSTRACT

A current monitor for sensing the current in a current path includes a resistive sensing element in a section of the current path and a current mirror circuit having a first semiconductor device and a second semiconductor device. Both semiconductor devices electrically interconnect with each other for copying the current in the second semiconductor device to the first semiconductor device. The first semiconductor device is electrically connected to an electric reference potential and to a current input side of the section via a resistive equivalence element in a first current branch. The second semiconductor device is electrically connected to the electric reference potential and to a current output side of the section in a second current branch. The current monitor further includes a constant current source for keeping the current in the second current branch independent from the potential difference between the potential of the current output side of the section and the reference potential.

13 Claims, 5 Drawing Sheets

CURRENT MONITOR FOR SENSING THE CURRENT IN A CURRENT PATH AND CORRESPONDING CONTROL DEVICE

The invention relates to a current monitor for sensing the current in a current path, said current monitor comprising a resistive sensing element in a section of said current path and a current mirror circuit comprising a first semiconductor device and a second semiconductor device, both semiconductor devices electrically interconnected with each other for copying the current in the second semiconductor device to the first semiconductor device, wherein the first semiconductor device is electrically connected to an electric reference potential and to a current input side of the section via a resistive equivalence element in a first current branch and wherein the second semiconductor device is electrically connected to the electric reference potential and to a current output side of the section in a second current branch.

A current monitor comprising a current mirror circuit for measuring the current in the path is known. The current monitor is for example based on a simple current mirror consisting of a pair of transistors electrically interconnected with each other for copying the current of the second transistor to the first transistor. The output voltage signal proportional to the current can be measured for example at the resistive equivalence element in the first current branch. In a current monitor based on the simple current mirror this signal strongly depends on the potential difference between the potential of the current measuring point in the current path and the reference potential (ground potential GND). On the other hand the simple current mirror shows a broad frequency bandwidth range.

A current monitor based on a Wilson current mirror with two contrariwise connected pairs of transistors on the contrary provides an output signal widely independent from said potential difference, but the current monitor based on the Wilson current mirror circuit shows low frequency bandwidth range for measuring a current with AC- and DC-portion.

One application for current monitors for measuring currents with AC- and DC-portion is the use in a control device for controlling a switching stage of a modulator system. For this application a precise measurement of the AC- and DC-portion of a current in a current path with high potential difference to ground potential in a wide frequency bandwidth range is needed.

U.S. Pat. No. 6,661,217 B2 describes a wideband precision current monitor employing DC-coupled and AC-coupled sensing circuits to generate lower and higher frequency sense signals, which are combined to form a wideband output signal that is proportional to a wideband current of interest. The frequency response of the wideband output signal is substantially flat across a wideband frequency range based on matching the frequency response of the DC- and AC-coupled sensing circuits.

It is the object of the invention to provide a simple and low priced current monitor with an enhanced frequency bandwidth range for measuring a current consisting of an AC- and DC-portion with an output voltage signal independent from a potential difference between the potential of the current measuring point in the current path and the reference potential.

This object is achieved by the present invention as defined in claim 1. The current monitor according to the invention comprises a constant current source for keeping the current in the second current branch independent from the potential difference between the potential of the current output side of the section and the reference potential. The current in the second current branch is copied to the first current branch by the current mirror. Because the current in the second current branch is a potential difference independent current, an output voltage signal measurable at a resistive element—like for example the resistive reference element—in the first current branch is as well independent from the potential difference between the potential of the current output side of the section and the reference potential (and of course independent from the potential difference between the potential of the current input side of the section and the reference potential as well).

The resistivity of the resistive equivalence element is chosen in such way, that the first and second semiconductor devices are on a common electrical potential. In the absence of other resistive elements—except for the resistive sensing element—in the section of the current path and/or the section of the second current branch between the current output side and the second semiconductor device, the resistivity of the resistive equivalence element is equal to the resistivity of the resistive sensing element (Rsens=Req).

In general the current mirror circuit of the current monitor can be realized as a simple current mirror or a Wilson current mirror. Preferably, the current mirror circuit is a simple current mirror consisting of just one pair of semiconductor devices electrically interconnected with each providing a wider frequency bandwidth. The frequency bandwidth of this simple current monitor is mainly determinate by the transition frequency of its semiconductor devices.

According to a preferred embodiment of the invention, a resistive output element for measuring its voltage drop is electrically arranged in the first current branch between the first semiconductor device and the reference potential. Because the resistive output element and the resistive equivalence element are connected in series in the first current branch (which is an "unbranched" current path), the ratio Vout/Veq of the voltage drop at the resistive output element Vout and the voltage drop at the resistive equivalence element Veq is given by the ratio of their resistivity Rout/Req. This ratio is an amplification factor of the measurable output voltage signal of the current monitor dropping at the resistive output element compared to the voltage dropping at the resistive reference element. Preferably a further resistive element is electrically arranged in the second current branch between the second semiconductor device and the reference potential to bring both semiconductor devices (first and second semiconductor device) on a common potential level.

According to another preferred embodiment of the invention, the constant current source is electrically arranged in the second current branch between the second semiconductor device and the reference potential. A constant current source based on the reference potential can be supplied by a voltage supply based on the reference potential. The constant current source preferably is electrically arranged in the second current branch between the further resistive element and the reference potential.

According to yet another preferred embodiment of the invention, the constant current source comprises a current mirror assembly supplied by a voltage supply. A constant current source comprising a current mirror assembly is a simple but effective current source for this application. Preferably, the constant current source further comprises the voltage supply.

According to another preferred embodiment of the invention, the current monitor further comprises a shunt reference element between the current path and the constant current source for providing the voltage supply of the constant current source.

Preferably, the constant current source further comprises a semiconductor component to constitute a diode assembly for compensation of temperature-dependent measurement errors of the current monitor.

According to a preferred embodiment of the invention, a semiconductor unit is electrically arranged in the first current branch between the first semiconductor device and the resistive output element, wherein said semiconductor unit is controlled by a current of the constant current source.

According to a preferred embodiment of the invention, the current monitor further comprises a parallel connection circuit of a first diode device and a second diode device being connected parallel to the section of the current path, wherein the two diode devices are anti-parallel connected with respect to each other. The first diode device and the second diode device are adapted for limiting the magnitude of the electric signal.

According to yet another preferred embodiment of the invention, the first and second semiconductor devices are bipolar transistors or field effect transistors, especially matching each other. The bipolar transistors are preferably PNP transistors with a typical transition frequency of about 150 MHz, especially BC856A PNP silicon transistors or BF550 PNP silicon transistors.

According to a preferred embodiment of the invention, the current mirror circuit is a current mirror circuit with a predetermined bandwidth of ≥20 MHz, preferably of ≥50 MHz, more preferably of ≥100 MHz for measuring the high frequency AC-components of the current in the current path.

According to another preferred embodiment of the invention, the current mirror circuit is a current mirror circuit adapted for a maximum potential difference between the electrical potential of the input side of the section and the electrical reference potential ≥30 Volts, preferably ≥40 Volts, more preferably ≥50 Volts.

According to yet another preferred embodiment of the invention, the current monitor is a current monitor adapted for a maximum electrical current through the resistive sensing element ≥5 A, preferably ≥6.6 A.

The current monitor further comprises a voltage tap electrically connected to the first current path between the first active semiconductor device and the resistive output element to tap an output voltage signal caused by the voltage drop at the resistive output element (Vout).

The invention further relates to a control device for controlling a switching stage in dependence of a current in a current path, said control device comprising an aforementioned current monitor, further comprising a comparator for converting an analog voltage signal caused by the voltage drop at the resistive output element to a digital switching signal. The control device preferably is a control device for controlling the switching stage of a modulator or power management system in dependence of the current in a current path between a power generator and a load.

These and other aspects of the invention will be apparent from and elucidated with reference to the embodiments described hereinafter.

Figure 1:
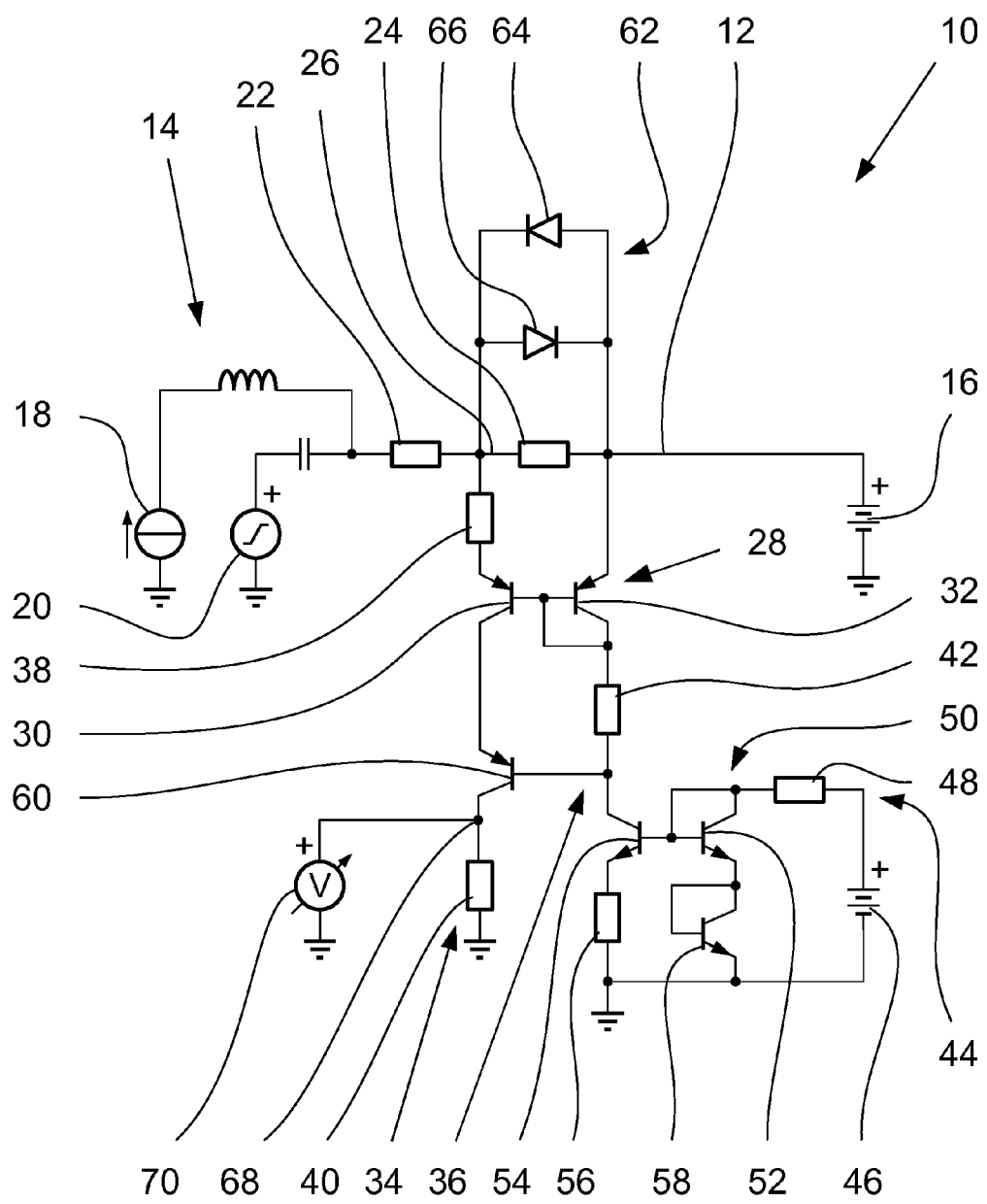
FIG. 1 shows a current monitor comprising a current mirror consisting of PNP transistors according to an embodiment of the invention.

FIG. 1 shows a simulation of a typical sensing situation with a current monitor 10 for sensing the current in a current path 12. The current path 12 guides from an external ideal current source 14 to an external ideal voltage source 16. The ideal current source 14 comprises a DC current source component 18 and an AC current source component 20. The voltage source 16 defines a potential difference between the current path 10 and the ground potential (mass) as a reference potential. A resistor 22 in the current path 12 defines the resistivity of said path 12.

The current monitor 10 comprises a resistive sensing element 24 in a section 26 of said current path 12 and a current mirror circuit 28 comprising a first semiconductor device 30 and a second semiconductor device 32. The first semiconductor device 30 is electrically integrated in a first current branch 34; the second semiconductor device 32 is electrically integrated in a second current branch 36. Both semiconductor devices 30, 32 are electrically interconnected with each other for copying the current in the second semiconductor device 32 (and the second current branch 36 respectively) to the first semiconductor device 30 and the first current branch 34. The two semiconductor devices 30, 32 are PNP transistors (BC856 transistors).

The emitter of the first semiconductor device 30 is electrically connected in a first node to a current input side of the section 26 of the current path 12 via a resistive equivalence element 38 and the collector of the first semiconductor device 30 is electrically connected to ground potential as an electric reference potential. The first current branch 34 comprises the first semiconductor device 30, a resistive equivalence element 38 and a resistive output element 40. The resistivity value of the resistive equivalence element 38 is equal to resistivity value of the resistive sensing element 24 (1Ω) to bring or keep the emitters of both semiconductor devices 30, 32 formed as PNP transistors on a common potential level. Because the resistive output element 40 and the resistive equivalence element 38 are connected in series in the first current branch 34, the ratio Vout/Veq of the voltage drop Vout at the resistive output element 40 and the voltage drop Vref at the resistive equivalence element 38 is given by the ratio of their resistivity Rout/Req. This ratio is an amplification factor of the measurable output voltage of the current monitor 10. The resistivity of the resistive sensing element is 1 Ohm (Rsense=1Ω), the corresponding resistivity of the resistive equivalence element is 1 Ohm as well (Req=1Ω) as well. The resistivity of the resistive output element is 1 Kilo Ohm (Rsense=1 kΩ) and the amplification factor is 1000.

The emitter of the second semiconductor device 32 is electrically connected in a second node to a current output side of the section 26 and the collector of the second semiconductor device 32 is electrically connected to the electric reference potential (ground potential). A further resistive element 42 is electrically arranged in the second current branch 36 between the second semiconductor device 32 and the reference potential to keep both semiconductor devices (first and second semiconductor device) 30, 32 on a common potential level.

The second current branch 36 comprises the second semiconductor device 32 and the further resistive element 42. The collector and the basis of the second semiconductor device 32 are shorted and the basis of the first and the basis of the second semiconductor device 30, 32 are electrically connected with each other by a line to copy the current in the second semiconductor device 32 (and the second current branch 36 respectively) to the first semiconductor device 30. The resistivity of the further resistive element is 1 kΩ.

The current mirror circuit 28 further comprises a constant current source 44 for keeping the current in the second current path 32 independent from the potential difference between the potential of the current output side of the section 26, especially at the second node, and the reference potential (ground potential). This constant current source 44 is electrically arranged in the second current branch 36 between the further resistive element 42 and the reference potential.

The constant current source 44 comprises a (5V-)voltage supply 46 electrically connected in line with a resistor 48 (resistivity: 2 kΩ) on a primary side and a current mirror assembly 50 which comprises a first and second transistor 52, 54 (NPN transistors BC846). On the output side of the constant current source 44 the emitter of the second transistor 54 is electrically connected to the further resistive element 42 and the collector of the second transistor 32 with an output side resistor 56 of the constant current source 44. The output side resistor 56 (resistivity: 300Ω) is electrically arranged between the second transistor 54 of the current mirror assembly 50 and the reference potential. The constant current source 44 further comprises a semiconductor component (NPN transistor BC846) constituting a diode assembly 58 for compensation of temperature-dependent measurement errors of the current monitor 10. The diode assembly 58 is electrically connected between the collector of the first transistor 52 and the reference potential. The constant current source 44 further comprises a semiconductor unit 60, which is electrically arranged in the first current branch 34 between the first semiconducfor device 30 and the resistive output element 40. The semiconductor unit 60 is a PNP medium frequency transistor (PNP transistor BF550) being part of a cascade connection of the constant current source 44.

The current monitor 10 further comprises a parallel connection circuit 62 of a first diode device 64 and a second diode device 66 being connected parallel to the section 26 of the current path 12, wherein the two diode devices 64, 66 are anti-parallel connected with respect to each other. The parallel connection circuit 62 with the diode devices 64, 66 limits the maximum voltage drop over the resistive sensing element 24.

Figure 5:
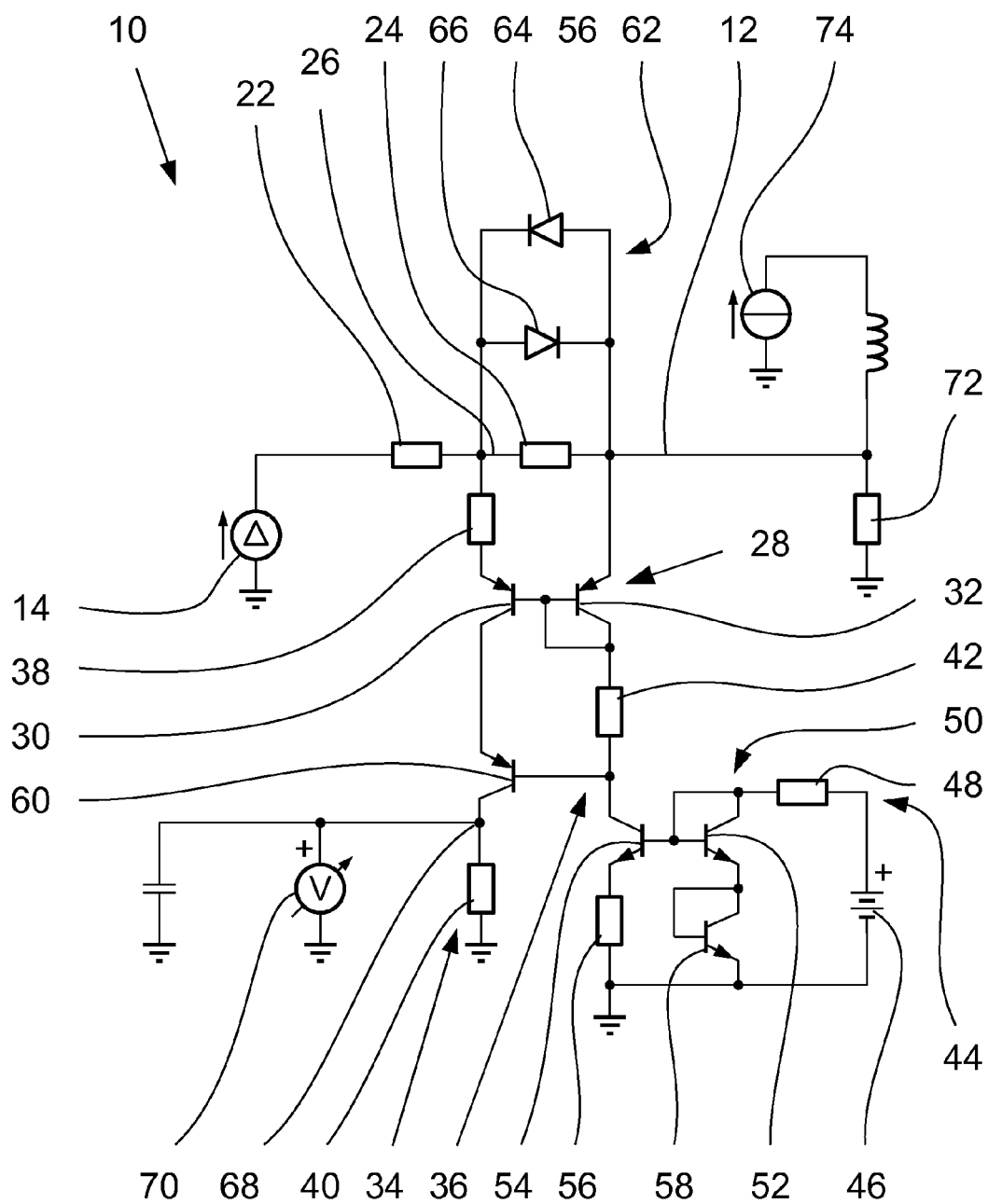
FIG. 5 shows the current monitor of FIG. 1 measuring the current in a current path connecting a current source with a constant load resistance.

The current monitor 10 further comprises a voltage tap 68 electrically connected to the first current path between the semiconductor unit 60 and the resistive output element 40 to tap an output voltage signal (Vout) caused by the voltage drop at the resistive output element 40. In FIG. 1 and FIG. 5 this voltage drop is measured by a voltmeter 70.

Alternatively to a separate voltage supply, the current monitor further comprises a shunt reference arrangement for voltage supply of the constant current source 44 (not shown). An output voltage signal proportional to the current in the sensing element drops at the resistive output element with respect to the reference potential.

Figure 2:
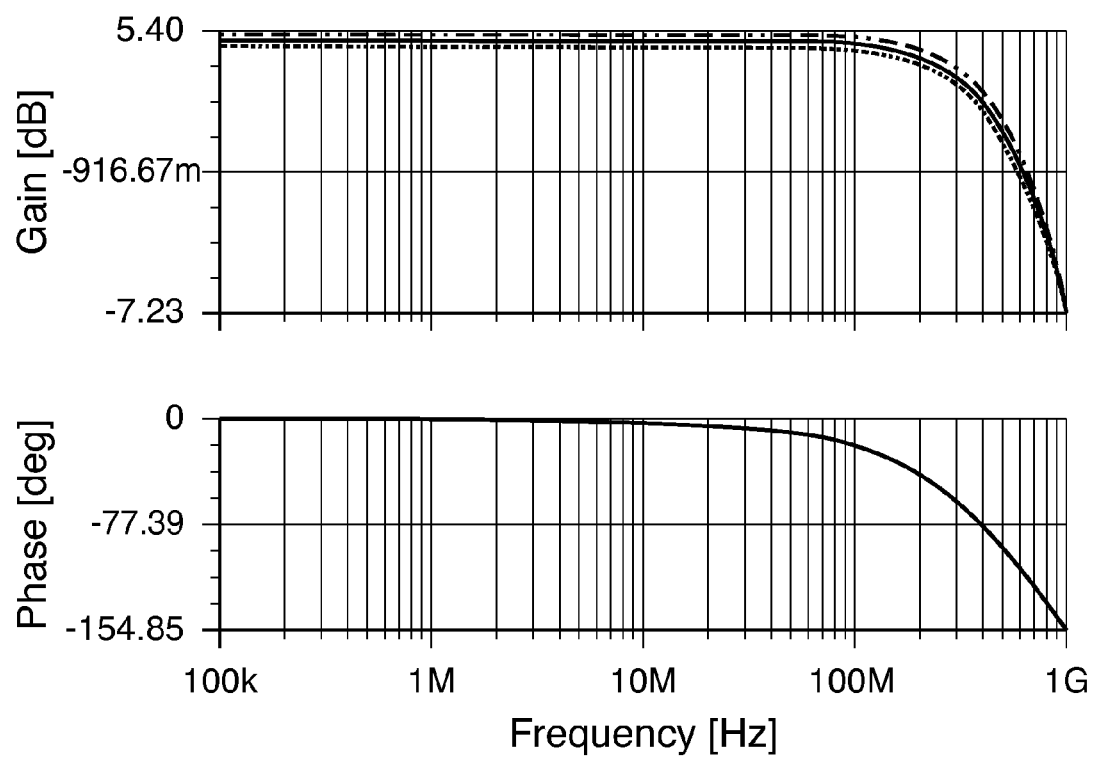
FIG. 2 shows a simulated output signal gain and output signal phase over a frequency range from 100 kHz to 1.0 GHz of the current monitor shown in FIG. 1.

FIG. 2 shows a simulated output signal gain (upper diagram) and output signal phase (lower diagram) over a frequency range from 100 kHz to 1.0 GHz of the current monitor shown in FIG. 1. The frequency response of the output signal characterizes the behavior of the current monitor 10. The cut-off frequency, also referred to as 3 dB cut-off frequency in the following, of the current monitor 10 corresponds to 200 MHz.

Figure 3:
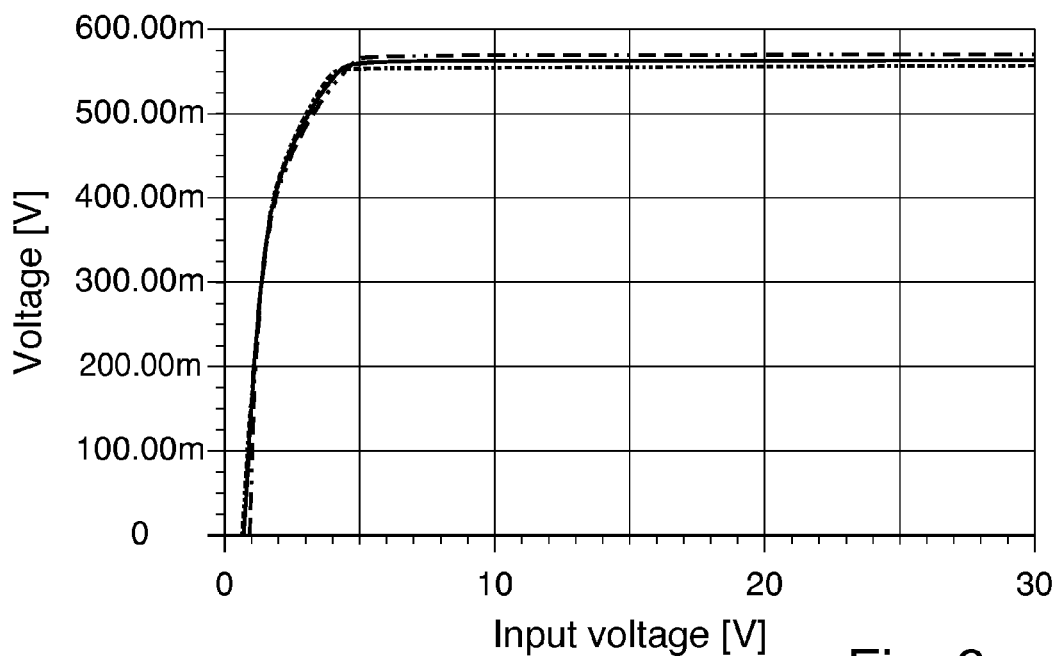
FIG. 3 shows a simulated output voltage signal level over a temperature range from 0° C. to 100° C.

The diagram in FIG. 3 shows the output voltage signal Vout versus the "input voltage", which is the potential difference between the potential of the current input side of the section and the reference potential (ground potential). In a voltage range of the input voltage from 5 V to 30 V the output voltage signal Vout is almost constant Vout=570 mV.

Figure 4:
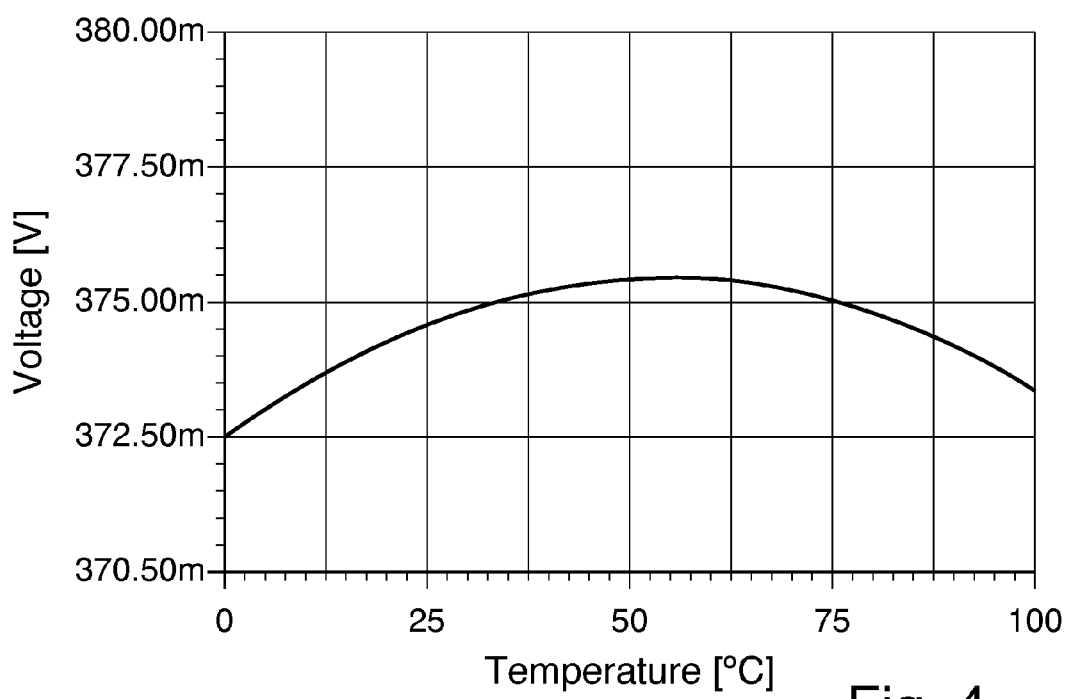
FIG. 4 shows a simulated output signal voltage level over a range of the potential difference between the potential of the current measuring point in the current path and the reference potential from 0 V to 30 V.

FIG. 4 shows a simulated output voltage signal Vout level over a temperature range from 0° C. to 100° C. varying over this range less than 1% (from 372.5 V to 375.1 V). This temperatureindependent behavior is due to the ideal current source 26 comprising the current mirror assembly 50 and the diode assembly 32.

FIG. 5 shows the current monitor 10 measuring the current in a current path 12 connecting a current source 14 with a load 72, which is electrically connected to a second current source 74 via an inductive element for simulation reasons.

Figure 6:
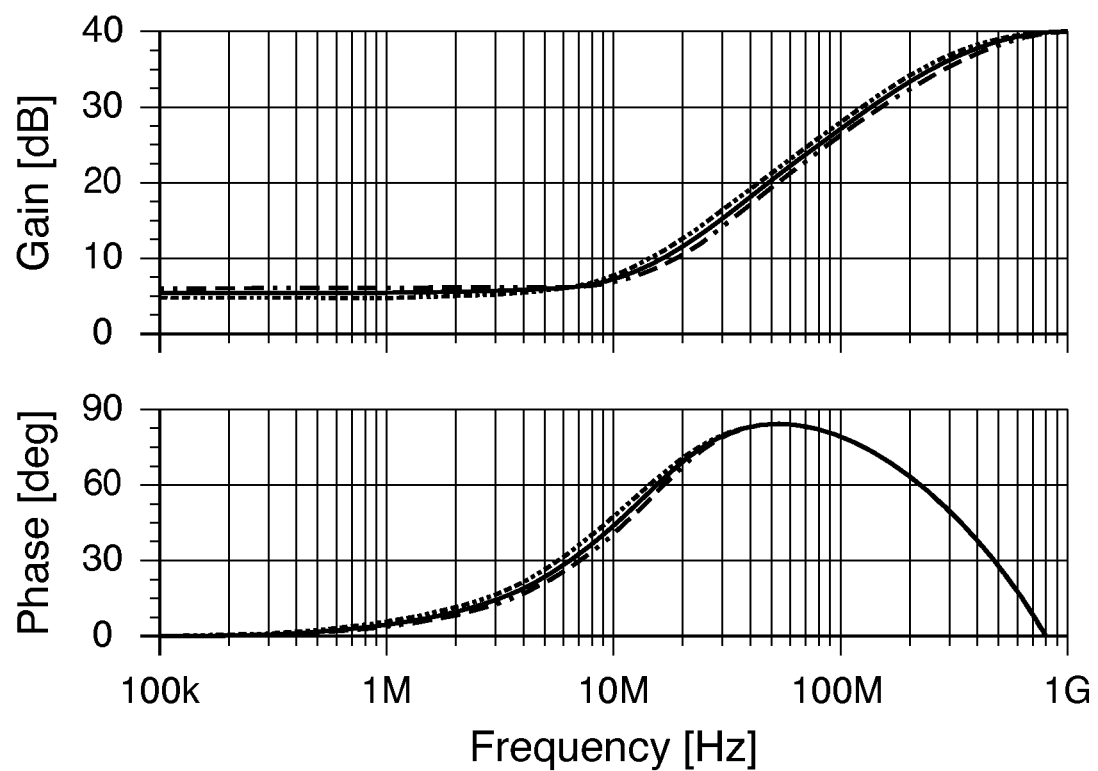
FIG. 6 shows a simulated output signal gain and output signal phase over a frequency range from 100 kHz to 1.0 GHz at an electric current of 200 mA and a load resistance of 100Ω as depicted in FIG. 5.

FIG. 6 shows a simulated output signal gain (upper diagram) and output signal phase (lower diagram) over a frequency range from 100 kHz to 1.0 GHz at an electric current of 200 mA and a load resistance of 100Ω as depicted in FIG. 5.

The bandwidth of the current monitor 10 corresponds to a value of 10.5 MHz. For a current of 200 mA and a resistance of 100Ω, representing the load 72, the pre-voltage at an output of the current monitor 10 corresponds to a value of 20 V. It is worth noting, that the frequency response depends on the load 72. The smaller the value of the load 72, the higher the value of the cut-off frequency and thus the larger the bandwidth of the current monitor 10. Furthermore, it is noted that the signal increases at higher frequencies. Moreover, it is noted that the current monitor 10, is adapted for processing current peaks up to 5 amperes. The first diode device 64 and the second diode device 66 are arranged in parallel to the sensing element 24 and operate as a low pass filter as well. Therefore, for a cut-off frequency of 100 MHz at a resistance of 1Ω, the capacitance of the diode devices 64, 66 should preferably be selected smaller than 1.6 nF. Since the measurement of the electric current is performed only in the positive flowing direction (from current input side to current output side, also a combination of a silicon diode device and a Schottky diode device is applicable. A Schottky diode device shows a small capacitance in the backward direction and a normal silicon diode device, also referred to as PN diode, shows a larger threshold value in the forward direction. It is noted, that the current monitor operates linearly up to 0.5 A.

Table 1 shows corresponding DC currents and bandwidth ranges of the current monitor 10 for different values of the resistivity of the load 72 simulated in the circuit of FIG. 5.

TABLE 1

Load resistivity, DC current and bandwidth ranges of the current monitor 10 shown in FIG. 5.

| Resistivity of the load 72 | DC current in the current path 12 | 3 dB-bandwidth of the current monitor 10 |
|---|---|---|
| 100 Ohms | 200 mA | 10.5 MHz |
| 50 Ohms | 400 mA | 21.0 MHz |
| 20 Ohms | 1.0 A | 44.4 MHz |
| 10 Ohms | 2.0 A | 83.7 MHz |
| 5 Ohms | 4.0 A | 195 MHz |
| 2 Ohms | 6.6 A | 555 MHz |

A major application for the current monitor 10 adapted for measuring currents with AC- and DC-portion is the use in a control device for controlling a switching stage of a modulator system, especially an envelope tracking modulator, in dependence of the current in a current path between a power generator and a load (not shown).

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. Current monitor for sensing the current in a current path, said current monitor comprising a resistive sensing element in a section of said current path and a current mirror circuit comprising:
 a first semiconductor device and a second semiconductor device, both semiconductor devices electrically interconnected with each other for copying the current in the second semiconductor device to the first semiconductor device,
  wherein the first semiconductor device is electrically connected to an electric reference potential and to a current input side of the section via a resistive equivalence element in a first current branch, and
  wherein the second semiconductor device is electrically connected to the electric reference potential via a resistive output element being electrically arranged in a first current branch between the first semiconductor device and the reference potential, and the first semiconductor device is electrically connected to a current output side of the section in a second current branch; and
 a constant current source for keeping the current in the second current branch independent from the potential difference between the potential of the current output side of the section and the reference potential, the constant current source comprising a current mirror assembly supplied by a voltage supply.

2. Current monitor according to claim 1, wherein the constant current source is electrically arranged in the second current branch between the second semiconductor device and the reference potential.

3. Current monitor according to claim 1, wherein the constant current source comprises the voltage supply.

4. Current monitor according to claim 1, further comprising a shunt reference element between the current path and the constant current source for providing the voltage supply of the constant current source.

5. Current monitor according to claim 1, wherein the constant current source further comprises a diode assembly for compensation of temperature-dependent measurement errors of the current monitor.

6. Current monitor according to claim 1, wherein a semiconductor unit is electrically arranged in the first current branch between the first semiconductor device and the resistive output element, wherein said semiconductor unit is controlled by a current of the constant current source.

7. Current monitor according to claim 1, wherein the current monitor further comprises a parallel connection circuit of a first diode device and a second diode device being connected parallel to the section, wherein the two diode devices are anti-parallel connected with respect to each other.

8. Current monitor according to claim 1, wherein the first and second semiconductor devices are bipolar transistors or field effect transistors.

9. Current monitor according to claim 1, wherein the current mirror circuit is a current mirror circuit with a predetermined bandwidth of $\geq 20$ MHz, preferably of $\geq 50$ MHz, more preferably of $\geq 100$ MHz.

10. Current monitor according to claim 1, wherein the current mirror circuit is a current mirror circuit adapted for a maximum potential difference between the electrical potential of the input side of the section and the electrical reference potential $\geq 30$ Volts, preferably $\geq 40$ Volts, more preferably $\geq 50$ Volts.

11. Current monitor according to claim 1, wherein the monitor is a current monitor adapted for a maximum electrical current through the resistive sensing element $\geq 5$ A, preferably $\geq 6.6$ A.

12. Control device for controlling a switching stage in dependence of a current in a current path, said control device comprising a current monitor according to claim 1, further comprising a comparator for converting an analog voltage signal caused by the voltage drop at the resistive output element to a digital switching signal.

13. Current monitor for sensing the current in a current path, said current monitor comprising a resistive sensing element in a section of said current path and a current mirror circuit comprising:
 a first semiconductor device and a second semiconductor device, both semiconductor devices electrically interconnected with each other for copying the current in the second semiconductor device to the first semiconductor device,
  wherein the first semiconductor device is electrically connected to an electric reference potential and to a current input side of the section via a resistive equivalence element in a first current branch, and
  wherein the second semiconductor device is electrically connected to the electric reference potential to a current output side of the section in a second current branch, and
 a constant current source for keeping the current in the second current branch independent from the potential difference between the potential of the current output side of the section and the reference potential, the constant current source comprising a current mirror assembly supplied by a voltage supply,
 wherein the current monitor further comprises a parallel connection circuit of a first diode device and a second diode device being connected parallel to the section, wherein the two diode devices are anti-parallel connected with respect to each other.

* * * * *